(12) United States Patent
Shiraishi

(10) Patent No.: US 6,335,786 B1
(45) Date of Patent: Jan. 1, 2002

(54) EXPOSURE APPARATUS

(75) Inventor: Naomasa Shiraishi, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/566,486

(22) Filed: May 8, 2000

Related U.S. Application Data

(63) Continuation of application No. PCT/JP98/05020, filed on Nov. 9, 1998.

(30) Foreign Application Priority Data

Nov. 10, 1997 (JP) .............................................. 9-306952

(51) Int. Cl.[7] ........................ G03B 27/54; G03B 27/70; G03B 27/72; F21V 7/00; G02B 5/08
(52) U.S. Cl. ............................. 355/67; 355/66; 355/71; 362/298; 359/850; 359/864
(58) Field of Search .............................. 355/53, 66, 67, 355/71; 359/599, 709, 707, 710, 729, 838, 850, 854, 856, 857, 864; 362/551, 556, 558, 560, 296, 297, 298, 302

(56) References Cited

U.S. PATENT DOCUMENTS

| 3,737,226 A | * | 6/1973 | Shank ........................... 355/67 |
| 3,913,872 A | * | 10/1975 | Weber .......................... 362/554 |
| 4,023,903 A | * | 5/1977 | Scheib ......................... 355/71 |
| 5,504,627 A | * | 4/1996 | Kim et al. .................... 359/729 |
| 5,629,805 A | * | 5/1997 | Fukuzawa ..................... 359/627 |
| 5,757,470 A | * | 5/1998 | Dewa et al. ................... 355/67 |
| 5,815,248 A | * | 9/1998 | Nishi et al. ................... 355/71 |

FOREIGN PATENT DOCUMENTS

| JP | 5-13301 | 1/1993 |
| JP | 5-232397 | 9/1993 |
| JP | 5-251308 | 9/1993 |
| JP | 6-84760 | 3/1994 |
| JP | 6-118331 | 4/1994 |
| JP | 7-263313 | 10/1995 |

* cited by examiner

Primary Examiner—Russell Adams
Assistant Examiner—Rodney Fuller

(57) ABSTRACT

The exposure apparatus has an illumination optical system equipped with an illuminance-uniformity unit (3A) composed of a diffusion plate (31), a conical prism (32), a reflecting member (34) in a columnar form, a reflecting member (33) in a cylindrical form, a fly-eye lens (35) and a stop (36). The exposure apparatus is for use in a lithography process for manufacturing semiconductors and so on. The illumination light from an optical system of a previous stage has an illuminance distributed in a uniform manner to some extent by multiple reflection between the reflecting plane of the reflecting member (34) and the reflecting plane of the reflecting member (33) via the diffusion plate (31) and the conical prism (32), and the illumination light is then led to a reticle at a high degree of illuminance through the fly-eye lens (35) and the stop (36).

30 Claims, 5 Drawing Sheets

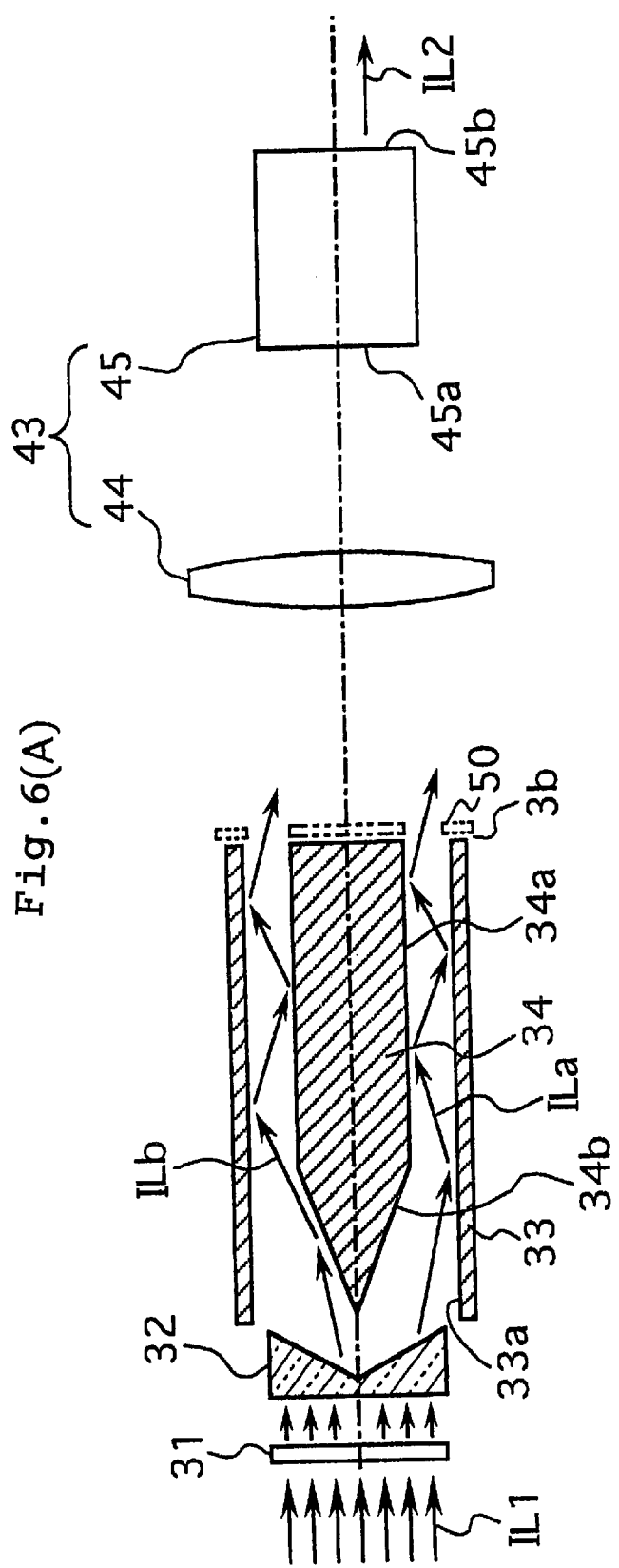
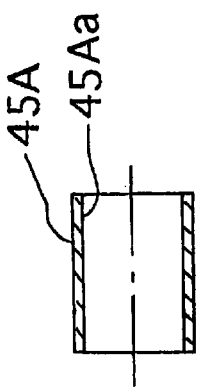
Fig. 6(A)
Fig. 6(B)

EXPOSURE APPARATUS

This application is a continuation of international application PCT/JP98/05020 filed Nov. 9, 1998.

BACKGROUND OF THE INVENTION

1. Field of the Invention

The present invention relates to an exposure apparatus for use in transferring a pattern formed on a mask onto a substrate in a lithography process for manufacturing semiconductor elements, image pickup elements (CCDs, etc.), liquid crystal display elements, thin-film magnetic heads, and the like. The exposure apparatus is particularly appropriate for use as an exposure apparatus for perform a so-called modified illumination.

2. Description of the Related Art

Hitherto, projection exposure apparatuses (steppers) of a batch exposure type have been extensively used which are designed to illuminate a reticle as a mask with an exposing illumination light from an illumination optical system and to project the mask pattern formed on the reticle as a reduced image onto each of shot regions on a wafer (or a glass plate, etc.) as a substrate, with a photoresist coated thereon, through a projection optical system. In recent years, attention has also been drawn to a projection exposure apparatus of a scanning exposure type (a scanning exposure apparatus), such as an exposure apparatus of a step-and-scan system that is capable of executing exposure by transferring a reticle and a wafer in synchronism with each other at a projection magnification that is set as a speed ratio, in order to transfer a pattern having a large area onto each shot region on the wafer with high precision without making a projection optical system larger in size.

For those conventional exposure apparatuses, a higher uniformity of the distribution of illumination is required so that line widths of a pattern image of the reticle to be transferred onto the wafer is made uniform in an illumination area of the projection optical system. In conventional techniques, an optical integrator including a fly-eye lens or a rod lens, etc. is disposed in an illumination optical system, in order to make the distribution of illumination uniform. When the fly-eye lens is adopted as an optical integrator, the plane of the fly-eye lens from which light leaves is typically set so as to form a plane that has a Fourier transform relationship with respect to the pattern plane of the reticle on which the pattern is formed (that is, a so-called "pupil plane").

Moreover, recently, higher resolution has been demanded. A simple increase in a numerical aperture of a projection optical system in an attempt to meet the requirement has the drawback that the depth of focus becomes shallower in inverse proportion to the second power of the numerical aperture. In order to overcome this problem, illumination optical system have been developed which utilize modified illumination techniques with a view to improving resolution and providing an increase in the depth of focus. Such systems are disclosed, for example, in Japanese Patent Application Laid-open No. 4-225,514 and a European counterpart, i.e., European Patent Application Publication No. (EP) 0 486 316 A2 (1992). This technique involves limiting a scope of an angle of incidence of an illumination light irradiated onto a reticle to a predetermined value. More specifically, the limitation is realized by locating a stop on a pupil plane, to thereby restrict a shape in section of an illumination flux. As the pupil plane is an optical Fourier transform plane for a pattern plane of the reticle, a scope of the angle of incidence of the illumination light on the pattern plane can be restricted by limiting the position of the illumination light passing through the pattern plane.

In the conventional modified illumination technique as described above, the illumination light flux is partially shaded on the pupil plane and the sectional shape thereof is restricted. Therefore, as a matter of course, this technique suffers from the disadvantage that illuminance of the illumination light decreases by an amount corresponding to the quantity of light cast in shade. This naturally leads to a decrease in the amount of light energy reaching a wafer. Consequently, a long exposure time is required to gain an appropriate quantity of exposure that is defined in accordance with a resist sensitivity. As a result, a throughput of the exposure apparatus involved is decreased.

SUMMARY OF THE INVENTION

The present invention has been completed to overcome the problems inherent in the conventional exposure apparatuses, and it has as its the object the provision of an exposure apparatus that is capable of attaining a high level of uniformity in a distribution of illuminance upon carrying out modified illumination or the like, and that can suppress a decrease in illumination of an illumination light.

The present invention has another objects to provide a method for manufacturing of the exposure apparatus and a method for device such as semiconductor elements and so on by using the exposure apparatus.

A first exposure apparatus in a first embodiment of the present invention is directed to an exposure apparatus that transfers a pattern formed on a mask R onto a substrate via a projection optical system PL under an exposing illumination light from an illumination optical system. The exposure apparatus comprises an illuminance-uniformity optical system 3A which includes a first reflecting member 34 having an outer plane consisting of two reflecting planes 34a and 34b in a planar form on the outer side of a columnar body, and a second reflecting member 33 having an inner plane facing the outer plane of the first reflecting member, which constitutes a reflecting plane 33a in a planar form on the inner side of a cylindrical body, and which is located within the illumination optical system. The illumination light passes through a clearance provided between the reflecting planes of the two reflecting members.

The exposure apparatus according to the present invention provides a uniform distribution of illumination light upon passage of the illumination light through a clearance provided between the reflecting planes of the two reflecting members 33 and 34, by way of multiple reflections or the like. After passage of the illumination light between the two reflecting members, substantially modified illumination is carried out by irradiating the illumination light onto the mask, the shape of which in section is in the form of a ring or in a form having plural apertures, or the like. Upon irradiation, the illumination light is not subject to any shading thus preventing any decreases in illuminance on the mask or substrate.

It is preferable for the two reflecting members 33 and 34 to be disposed in series with an optical integrator containing either a fly-eye lens 35 or a rod lens 45 being provided. This configuration enables uniformity of distribution of illuminance.

Furthermore, it is preferred that a plurality of illuminance-uniformity optical systems 3A and 3B are disposed so as to be shifted to enable shapes of the reflecting planes 34a and 34b of the first reflecting member 34 or a reflecting plane 38a of a first reflecting member 38 to be made to differ from one another. The shifting of the illuminance-uniformity optical systems 3A and 3B enables the use of illumination, such as a ring form illumination or illumination by means of a plurality of secondary light sources, in accordance with the type of patterns on a mask.

Moreover, it is preferred that the optical integrator 3C containing either the fly-eye lens or the rod lens be disposed in a row with the illuminance-uniformity optical systems so as to enable shifting relative to each other. This configuration can also to be used to carry out ordinary illumination.

By way of example, the first reflecting member 34 may have the reflecting plane in the form of a conical plane 34b on its light-entering plane side and in the form of a columnar plane 34a on the plane side extending therefrom. In this case, it is preferable that transparent spacers 51 and 52 each in a ring form be disposed between the first and second reflecting members 34 and 33. The light-entering plane side in the conical plane form 34b leads the entering illumination light to the light-leaving plane side with minimal loss in quantity of light, thereby allowing a substantial ring form illumination. In addition, the spacers can achieve rapid relative positioning of the two reflecting members and maintain a stable position relationship therebetween.

As an alternative example, the first reflecting member may be comprised of the member 38 configured such that the shape in section of the plane perpendicular to the optical axis (IAX) of the illumination optical system is in a cross form with the optical axis disposed in the center, and such that the outer plane constitutes a reflecting plane. The use of the member 38 enables modified illumination to be employed using four secondary light sources.

Moreover, it is preferable for an optical element 32 to be disposed on the light-entering plane side of the two reflecting members, to thereby shape a distribution of illuminance on the plane perpendicular to the optical axis IAX of the illumination optical system into a ring form. Examples of such an optical element includes a conical prism or a pyramid prism. The disposition of such an optical element enables a further decrease in a loss of the illumination light on the light-entering plane sides of the two reflecting planes.

A second exposure apparatus according to the embodiment of the present invention is directed to an exposure apparatus having an illumination optical system which irradiates the mask R with an illumination light and transfers a pattern formed on the mask R onto a substrate W, wherein bar-shaped optical elements 33 and 34 are disposed on the optical axis IAX of the illumination optical system, the bar-shaped optical elements being provided with first and second reflecting planes 34a and 33a, respectively, which reflect the illumination light within a clearance between them, with the illumination light passing through the clearance provided between the first and second reflecting planes thereof leaving from outside a region containing the optical axis on the light-leaving plane of the bar-shaped optical elements.

In accordance with the present invention as described above, the illumination light is made uniform in a distribution of illuminance by the passage through a clearance provided between the two reflecting planes of the bar-shaped optical elements. Furthermore, after the passage of the illumination light through such a clearance between the reflecting planes, the illumination light is shaped in section into a ring form with the optical axis disposed in the center or in a form having plural apertures, or the like, and the irradiation of such the illumination light can perform a substantially modified illumination. In this way, shading the illumination light and a resulting decrease in illuminance on the mask or on the substrate can be prevented.

An example in this case where the region of distribution of the illumination light is defined on the light-leaving plane side of the bar-shaped optical elements by the first and second reflecting planes, is in a ring form. This can substantially perform a ring illumination.

Furthermore, an alternative example of the partial region of distribution of the illumination light defined on the light-leaving plane side thereof by the first and second reflecting planes is in a cross form. This arrangement enables modified illumination to be performed using an illumination light from four secondary light sources.

Moreover, it is preferable for the illumination optical system to contain the optical integrator(s) (35 or 44 and 45) disposed on the light-leaving plane side of the bar-shaped optical elements (33, 34). Such a configuration of the illumination optical system provide an increase in uniformity of the distribution of illuminance.

An example of the optical integrator may include the fly-eye lens 35. In this configuration, the fly-eye lens is disposed such that its light-entering plane is close to the light-leaving plane side 3b of the bar-shaped optical elements or is disposed on a plane generally conjugate with the light-leaving plane side 3b of the bar-shaped optical elements. This configuration results in minimal loss in quantity of illumination light upon passage through the bar-shaped optical elements.

The illumination optical system for use in this configuration may preferably be disposed in close vicinity to the light-entering plane side of the fly-eye lens 35 and that the illumination optical system may preferably contain an aperture stop having an aperture shape resembling an array of plural optical elements constituting the fly-eye lens. FIG. 2(A) shows an example of the stop 36 disposed on the light-entering plane side of the fly-eye lens 35. The stop can shade an optical element in the fly-eye lens, into which the illumination light enters only partially, thereby improving the uniformity in distribution of illuminance.

In addition, the fly-eye lens 35 may be configured such that the plane of focus on the light-leaving plane side thereof is disposed on the optical Fourier transform plane for the pattern plane of the mask and that the aperture stop 36 defining the shape of the secondary light source is interposed between the fly-eye lens and the mask within the illumination optical system. This configuration of the stop also enables an improvement in the uniformity in distribution of illuminance as the stop partially covers an image of the light source of the optical element into which the illumination light partially enters.

An alternative example of the optical integrator may contain the rod lens 45. It is preferable for rod lens to have the light-entering plane side 45a disposed on the optical Fourier transform plane with respect to the light-leaving plane 3b of the bar-shaped optical elements. This configuration is effective in leading the illumination light passing through the bar-shaped optical elements to the rod lens, with a reduction the quantity of light lost.

Moreover, the rod lens 45 preferably has the light-leaving plane 45b disposed on the plane generally conjugated with the pattern plane of the mask and the illumination optical system preferably contains a stop 50 disposed on the optical Fourier transform plane with respect to the pattern plane of the mask. The stop can set a coherence factor ($\sigma$ value) of the illumination optical system with a high degree of accuracy.

In this configuration, it is preferable for the stop 50 to be disposed on the side closer to the bar-shaped optical elements than the rod lens. This configuration enables the stop to be disposed without making the illumination optical system larger in size.

The illumination optical system may also be configured such that it preferably contains second bar-shaped optical elements 37 and 38 each having a light-leaving plane with a shape different to that of the first bar-shaped optical elements 33 and 34 and that the second bar-shaped optical elements can be exchanged for the first bar-shaped optical elements 33 and 34 or vice versa so as to be disposed in the path of the illumination light. This configuration enables shifting of illuminating processes to be conducted in accordance with the type of pattern on the mask.

The illumination optical system may further be preferably configured such that it contains an optical integrator 3C to be disposed in the path of the illumination light instead of the bar-shaped optical elements or the second bar-shaped optical elements, with either of the bar-shaped optical elements, the second bar-shaped optical elements or the optical integrator being selected and disposed in the path of the illumination light, in accordance with the type of pattern on the mask. The disposition of the optical integrator enables an ordinal illumination to be provided with the distribution of the illumination light on the pupil plane being in a circular form.

A description will now be given regarding a method for manufacturing the first exposure apparatus according to the present invention. The method for manufacturing the first exposure apparatus involves manufacturing the exposure apparatus that transfers a pattern formed on a mask onto a substrate through a projection optical system under an exposing illumination light from the illumination optical system. The first exposure apparatus according to the present invention can be assembled in such a manner that the first reflecting member 34 is disposed in the illumination optical system, which has the outer plane consisting of the reflecting planes 34a and 34b in the planar form on the outer side of a columnar body, and the second reflecting member 33 is disposed so as to enclose the first reflecting member, the second reflecting member having the inner plane facing the outer plane of the first reflecting member, which constitutes the reflecting plane 33a in the planar form on the inner side of a cylindrical body, so that the illuminance-uniformity optical systems 3A which allows the illumination light to pass through a clearance provided between the reflecting planes of the two reflecting members is incorporated thereinto.

A method for manufacturing the second exposure apparatus according to the present invention will also be described. The method for manufacturing the second exposure apparatus involves producing the exposure apparatus having the illumination optical system which irradiates the mask with the illumination light and transferring a pattern formed on the mask onto a substrate, which comprises preparing the bar-shaped optical elements 34 and 33 having the first and second reflecting planes, respectively, which reflect the illumination light within them, and aligning the bar-shaped optical elements on the optical axis of the illumination optical system so that the illumination light passing through the clearance provided between the first and second reflecting planes 34a and 33a leaves from the outside of a region containing the optical axis thereof on the light-leaving planes of the bar-shaped optical elements.

A description will further be given regarding a method which produces an objective device by using the first or second exposure apparatus according to the present invention. The method includes the process of transferring an image of the pattern formed on the mask onto a substrate through the first or second exposure apparatus. The exposure apparatus according to the present invention can substantially perform a modified illumination with a high illumination efficiency, so that, for example, devices having fine circuit patterns recurring in cycles can be produced with a high degree of accuracy and at a high throughput.

Other objects, features and advantages of the present invention will become apparent in the course of the following description with reference to the accompanying drawings.

BRIEF DESCRIPTION OF THE DRAWINGS

FIG. 6(A) is a view in section showing a side of a portion of the illuminance-uniformity unit according to the second embodiment of the present invention, and FIG. 6(B) is a view in section showing a cylindrical member for use in place of the rod lens.

DETAILED DESCRIPTION OF THE INVENTION

The present invention in preferred embodiments will be described in more detail with reference to the accompanying drawings. First, a description will be given regarding the first embodiment showing the best modes of the present invention with reference to FIGS. 1 to 5.

Figure 1:
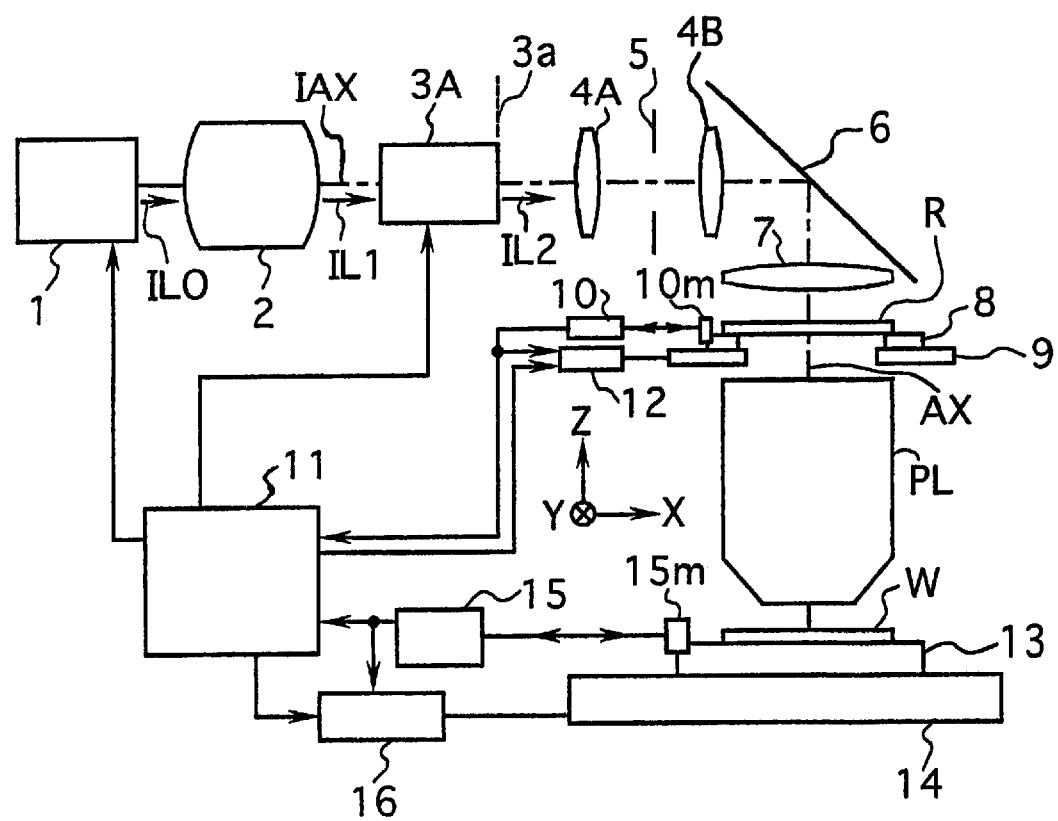
FIG. 1 is a schematic view showing the configuration of a projection exposure apparatus for use in the first embodiment of the present invention.

FIG. 1 shows a projection exposure apparatus according to the first embodiment of the present invention, wherein an exposing illumination light IL0 left from an exposing light source 1 is shaped into an illumination light IL1 of a generally circular form having a sectional shape of a predetermined dimension upon passage through a shaping optical system 2, and the illumination light IL1 enters into the first illuminance-uniformity unit 3A along the optical axis IAX forming a number of secondary light sources distributed in a predetermined shape (e.g., in a ring shape in this embodiment) on a light-leaving plane 3a of the illuminance-uniformity unit 3A. In this embodiment, two other illuminance-uniformity units may be disposed, in addition to the first illuminance-uniformity unit 3A, so as to be exchangeable with one other. The configurations of the other illuminance-uniformity units will be described hereinafter. As the exposing light source 1, there may be used, for example, excimer laser light sources, e.g., KrF, ArF or $F_2$, a higher harmonics generator for YAG laser or mercury lamp, or the like. The illuminance-uniformity unit 3A has the light-leaving plane 3a thereof disposed so as to constitute an optical Fourier transform plane (pupil plane) with respect to a pattern plane of a reticle R as an object for transcription.

The illumination light IL2 passed through the illuminance-uniformity unit 3A illuminates an illumination region on the pattern plane (the bottom plane) of the reticle R through a first relay lens 4A, a variable vision field stop (reticle blind) 5, a second relay lens 4B, a mirror 6 which turns the light path of the illumination light, and a condenser lens 7. The plane on which the variable vision field stop 5 is disposed is conjugated with the pattern plane of the reticle R, and the illumination region on the reticle R is defined by the shape of the aperture of the variable vision field stop 5. An image of a pattern within the illumination region of the reticle R is reduced at a projection magnification β (β being a ¼-fold or ⅕-fold magnification for example) through a projection optical system PL telecentric at the both sides (or at the one side on the wafer side) and projected onto an exposure region on the wafer W with a photoresist coated thereon. The wafer W may be used as a substrate for semiconductors (silicon, etc.) or SOI (silicon-on-insulator), etc. In this configuration, the illumination optical system consists of a combination of the elements disposed between, and including, the exposing light source 1 and the condenser lens 7 and the optical axis obtained by turning the optical axis AX of the illumination optical system disposed before the mirror 6 by means of the mirror 6 is arranged so as to align with the optical axis AX of the projection optical system PL. The following description will be given by defining the axis parallel to the optical axis AX of the projection optical system PL as a Z-axis, the axis on the plane perpendicular to the Z-axis and parallel to the paper plane of FIG. 1 as an X-axis, and the axis perpendicular to the paper plane of FIG. 1 as a Y-axis.

As the image of the pattern on the reticle R is projected onto the exposure region on the wafer W, the reticle R is adsorbed and held on a reticle stage 8 and the reticle stage 8 is transferred in an X-direction or in a Y-direction or in a rotational direction to align the reticle R on a reticle base 9. The two-dimensional position of the reticle stage 8 (the reticle R) is measured by a moving mirror 10 m fixed at the edge portion of the reticle stage 8 and an outside laser interferometer 10. The operation of the reticle stage 8 is controlled by a reticle stage drive system 12 on the basis of the measured value of the two-dimensional positions of the reticle stage 8 and control information from a main control system 11 which implements overall control of the entire operation of the apparatus. The measured value obtained by the laser interferometer 8 is also supplied to the main control system 11.

On the other hand, the wafer W is adsorbed and held on a wafer holder (not shown). The wafer holder is fixed on a sample base 13 which in turn is fixed on a wafer stage 14. The sample base 13 is arranged so as to control the focus position (the position in the Z-direction) and a tilt angle of the wafer W, while the wafer stage 14 aligns the sample base 13 in the X-direction and/or Y-direction for example. The two-dimensional position of the sample base 13 (i.e., the wafer W) is measured by a moving mirror 15 m fixed at the top of the sample base 13, and an outside laser interferometer 15. The operation of the wafer stage 14 is controlled, for example, in a linear motor type, by a wafer stage drive system 16 on the basis of the measured value of the two-dimensional position of the reticle sample base 13 and control information from the main control system 11. The measured value obtained by the laser interferometer 15 is also supplied to the main control system 11.

The main control system 11 also controls the action of the emission of light from the exposing light source 1. In the case where the projection exposure apparatus is a projection exposure apparatus of a batch exposure type (i.e., a stepper type) and the exposing light source is a laser light source, as in this embodiment, the oscillation (emission) of the exposing light source is continued until the quantity of exposure reaches a predetermined level in a state in which a shot region of the wafer W as an object for exposure remains in an exposure region for the projection optical system PL. Thereafter, the next shot region is transferred to an exposure region by the stepwise movement of the wafer stage 14 and an image of a pattern of the reticle R is then transferred in a step-and-repeat system on each shot region of the wafer W. On the other hand, if a lamp light source is used for the exposing light source 1, an emission time of the exposing light source 1 can be controlled by closing or opening a shutter (not shown). In any case, a throughput of the exposure step can be improved as the exposure time that provides an appropriate exposure quantity for the photoresist on the wafer W, i.e., the exposure time per shot region, can be shortened in the case where an illuminance of the illumination light IL2 (in the case of a laser light source, the product obtained by multiplying pulse energy by an oscillating frequency) is high.

The present invention can also be applied to a projection exposure apparatus of a step-and-scan type. For such a projection exposure apparatus, the reticle stage 8 is also provided with a continuous transfer mechanism that transfers the reticle R in a predetermined direction (e.g., in a Y-direction). The projection exposure apparatus of this type is configured such that the projection optical system PL scans the reticle and the wafer W in synchronism with each other at a projection magnification β as a speed rate via the reticle stage 8 and the wafer stage 14, respectively, upon scanning exposure. The emission of the exposing light source 1 (or the opening or closing of the shutter) is performed in a region where the reticle stage 8 is synchronous with the wafer stage 14. For the projection exposure apparatus of this system, a throughput can be improved, as in the projection exposure apparatus of the batch exposure type, when the illuminance of the illumination light IL2 is high, because the speed of transferring the wafer at the time of scanning exposure can be increased, which provides an appropriate exposure quantity for the photoresist on the wafer W.

Moreover, the illuminance-uniformity unit 3A is used in this embodiment, so that a ring illumination as a modified illumination technique can be carried out to provide high resolution and depth of focus for a predetermined pattern of the reticle. In this embodiment, the illuminance of the illumination light IL2 can be maintained at a high level because a predetermined optical member is used, as will be described hereinafter, although there is a tendency of decreasing the illuminance of the illumination light in the case of the conventional modified illumination. The exposure apparatus in this embodiment can achieve a high imaging feature as well as a high throughput.

Figure 2A:
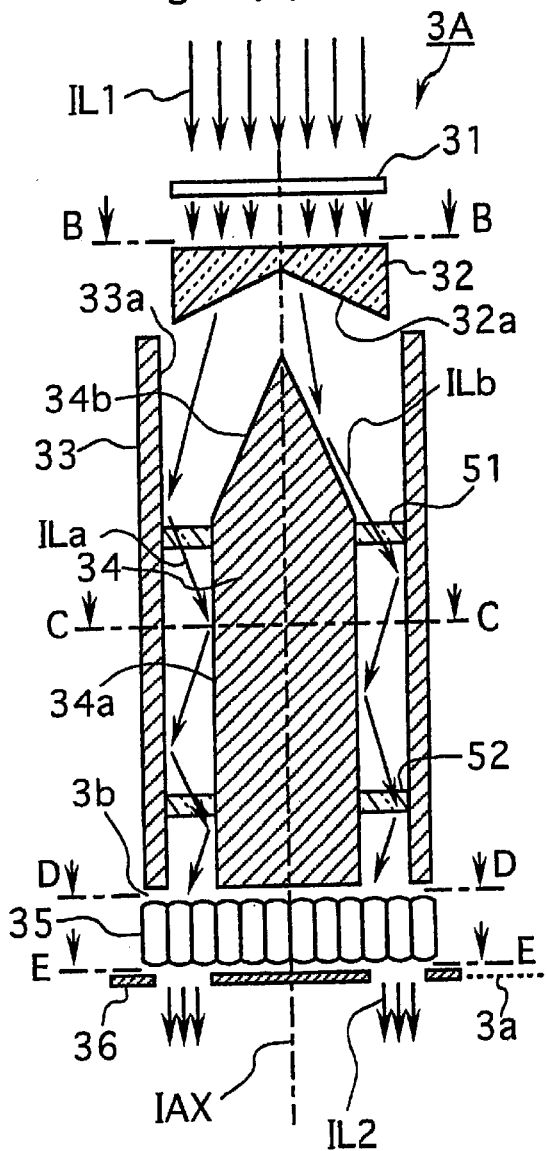
FIG. 2(A) is a side view in section showing a section of a first illuminance-uniformity unit 3A.
Figure 2B:
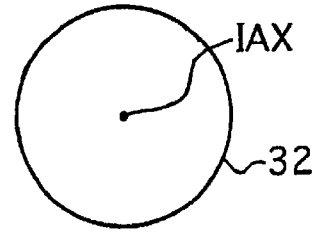
FIG. 2(B) is a view in section showing the first illuminance-uniformity unit 3A when taken along line B—B of FIG. 2(A).

FIG. 2(A) is a side view depicting a section of the illuminance-uniformity unit 3A for use in this embodiment. As shown in FIG. 2(A), the illumination light IL1 entering along the optical axis IAX from the shaping optical system 2 of FIG. 1 enters into a conical prism 32 after diffusion by a diffusion plate 31 made of frosted glass or otherwise. The conical prism 32 is a prism having the light-entering plane in the planar form and the light-leaving plane 32a in the form of a concave conical plane and having an outer shape in the circular form larger than a shape in section of the illumination light IL1 entering thereinto, as shown in FIG. 2(B).

The illumination light IL1 passing through the conical prism 32 is left in the form of a light flux that is diffused with the optical axis IAX in the center, and it enters into a uniform clearance provided between the first reflecting member 34 and the second reflecting member 33. The first reflecting member 34 may be a columnar member made of metal and having the optical axis IAX. The first reflecting member 34 is configured such that the outer side plane on the side of the conical prism 32 constitutes a reflecting plane 34b in the form of a convex conical plane and the outer side plane extending therefrom constitutes a reflecting plane 34a in the form of a columnar plane. The second reflecting member 33 is a cylindrical member made of metal, disposed so as to enclose the first reflecting member 34 with the optical axis IAX functioning as an axis. The second reflecting member 33 is configured such that the inner side plane constitutes a reflecting plane 33a in the form of a columnar plane and the planes on the light-leaving edge sides of the two reflecting members 33 and 34 are disposed on the identical flat plane. These reflecting planes 33a, 34a and 34b are each coated on their metal surface with metal such as chromium (Cr) or the like that can reflect the illumination light IL1 at a high reflection rate. In another embodiment of the present invention, the reflecting members 33 and 34 may be made of glass with the surfaces thereof acting as the reflecting planes coated with metal.

In this embodiment, the reflecting plane 34b on the light-entering side of the first reflecting member 33 (on the side of the conical prism 32) is in the form of a conical plane, so that a loss of the illumination light IL1 on the light-entering side can be lessened.

For instance, in this embodiment, alignment spacers 51 and 52, each being in a ring shape and being made of a transparent glass substrate or the like, may be disposed at two locations in the clearance between the two reflecting members 33 and 34. The spacers 51 and 52 allow a quick and accurate alignment of the positions of the two reflecting members 33 and 34 and hold an unvarying relationship of the two reflecting members 33 and 34 during operation of the projection exposure apparatus. As an alternative example, small support jigs or the like may be disposed at plural locations in the clearance so as to support the reflecting member 34 for the reflecting member 33 or vice versa, without using the spacers 51 and 52.

Figure 2C:
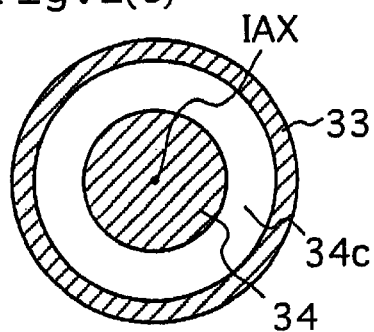
FIG. 2(C) is a view in section showing the first illuminance-uniformity unit 3A when taken along line C—C of FIG. 2(A).
Figure 2D:
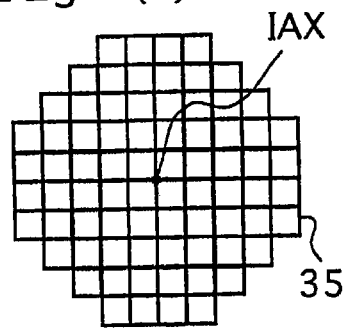
FIG. 2(D) is a view in section showing the first illuminance-uniformity unit 3A when taken along line D—D of FIG. 2(A).

With the configurations as described above, the clearance 34c between the reflecting plane 34a of the first reflecting member 34 and the reflecting plane 33a of the second reflecting member 33 becomes a uniform shape having a section in the ring form with the optical axis IAX disposed in the center, as shown in FIG. 2(C). The two reflecting members 33 and 34 may also be referred to collectively as bar-shaped optical elements in this embodiment.

As shown in FIG. 2(A), the illumination light ILa and ILb diffused from the conical prism 32 are reflected in a recurring way on the reflecting planes 34b, 34a and 33a and then left from the clearance between the first reflecting member 34 and the second reflecting member 33. This multiple reflection serves in improving the uniformity in the distribution of illuminance of the illumination light, like multiple reflection as in a conventional rod lens, and provides an illumination light in the ring form with a uniform distribution of illuminance on the light-leaving plane 3b of the reflecting members 34 and 33. Therefore, the uniformity in the distribution of illuminance on the reticle R can be achieved at a practically high level even if the illumination light left from the light-leaving plane 3b is irradiated onto the reticle R through a system containing from the relay lens 4A to the condenser lens 7 of FIG. 1. In this embodiment, however, the fly-eye lens 35 is further disposed in the vicinity of the light-leaving plane 3b in order to ensure a higher uniformity in the distribution of illuminance.

Figure 2E:
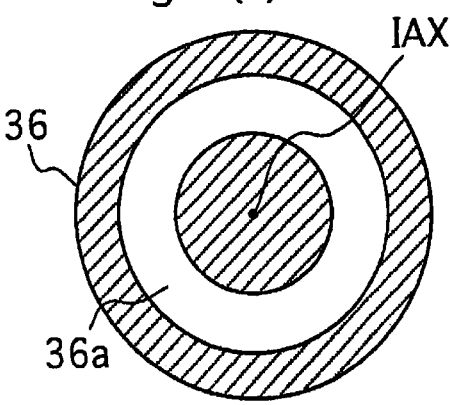
FIG. 2(E) is a view in section showing the first illuminance-uniformity unit 3A when taken along line E—E of FIG. 2(A).

More specifically, as shown in FIG. 2(A), the fly-eye lens 35 is disposed close to the light-leaving plane 3b of the two reflecting members 33 and 34 and a stop 36 having an aperture in the ring form is disposed on the focal plane on the light-leaving side of the fly-eye lens 35, i.e., the light-leaving plane 3a of the illuminance-uniformity unit 3A. As specifically shown in FIG. 2(D), the fly-eye lens 35 is configured such that a large number of lens elements each having a rectangular section are disposed and attached closely in longitudinal and latitudinal arrangements and that the sectional shape of the fly-eye lens 35 is so large as to cover a sectional shape of the inner plane of the reflecting member 33 disposed on the external side. Furthermore, as shown in FIG. 2(E), the size of the aperture 36a of the stop 36 in the ring shape is set to be smaller than that of the outer sectional shape of the fly-eye lens 35. The aperture 36a has a shape in section as approximately large as the sectional shape of the clearance 34c in the ring form between the reflecting members 33 and 34, as shown in FIG. 2(C). Moreover, the aperture 36a is in the form that can cover an image of the light source formed by the lens elements into which the illumination light enters partially, as will be described hereinafter. The illumination light ILa and ILb left from the light-leaving plane 3b are led through the fly-eye lens 35 and the stop 36 to the relay lens 4A of FIG. 1 as the illumination light IL2.

It is to be understood herein that, as the clearance in the ring form at the light-leaving plane 3b of the clearance between the reflecting members 33 and 34 functions substantially as a stop with an aperture in the ring shape in this embodiment, the stop 36 is not necessarily disposed. If the stop 36 is not disposed, however, there is the risk that the uniformity in the distribution of illuminance on the reticle R might be impaired by a light flux left from the lens elements out of the lens elements of the fly-eye lens 35, into which the illumination light enters into only a portion of the light-entering plane thereof, as the light flux left from such lens elements is irradiated onto the reticle R. Therefore, the stop 36 plays a role of improving the uniformity in the distribution of illuminance by blocking off the light flux (i.e., the image of the light source) from such lens element, so that it may be disposed on the side of the light-entering plane side of the fly-eye lens 35 in this sense. In this case, however, it is preferred that the shape of the stop 36 corresponds to a shape of the boundary of the region of the lens elements out of each lens element of the fly-eye lens 35, into which the illumination light enters on its entire area from the two reflecting members 33 and 34.

From the above description, it can be noted herein that the use of the illuminance-uniformity unit 3A in this embodiment can perform a ring illumination at a high level of uniformity in the distribution of illuminance as well as prevent a decrease in the illuminance of the illumination light IL2.

The clearance provided between the first reflecting member 34 and the second reflecting member 33 may be filled with gases or in a vacuous state and a light-transmittable material such as glass or the like may also be used at a portion thereof. In this case, the disposition of the spacers 51 and 52 can be omitted.

In order to provide for the inner side plane of the second reflecting member 33 to act as the reflecting plane 33a, the cylindrical reflecting member may be configured in such a manner that it is divided into a plurality of member sections so as to contain the optical axis and the plural member sections are coated on their depressed surfaces with a coating that can provide a high degree of reflection, and the coated member sections are again assembled into the reflecting member in a cylindrical form. This configuration allows easy processing of the reflecting member.

A high level of the uniformity in the distribution of illuminance can be ensured in this embodiment due to the disposition of the diffusion plate 31 on the light-entering plane side, however, the diffusion plate 31 is not necessarily used. In the case where the diffusion plate 31 is not used, an efficiency of utilization of the illumination light is rather improved.

In the above embodiment, the conical prism 32 is used for the division of the illumination light IL1. A diffraction grating of a phase type can also be used in place of the conical prism 32. At least one optical element (e.g., a lens) out of the optical elements disposed on the light-entering side of the illuminance-uniformity unit 3A may also be configured so as to vary the distribution of the illumination light on the light-entering plane side of the reflecting members 33 and 34 by transferring it in the direction of the optical axis of the illumination optical system.

The second illuminance-uniformity unit 3B for use in this embodiment will now be described with reference to FIG. 3. The illuminance-uniformity unit 3B differs from the illuminance-uniformity unit 3A in that the shape of the secondary light source for the second illuminance-uniformity unit 3B is divided into four apertures (light sources) with the optical axis disposed in the center while the shape of the secondary light source for the first illuminance-uniformity unit 3A is in a ring form. The following description is directed to the case where the second illuminance-uniformity unit 3B of FIG. 3 is disposed between the shaping optical system 2 and the first relay lens 4A as shown in FIG. 3. In FIG. 3, the parts and elements corresponding to those of FIG. 2 are provided with the same reference numerals and symbols and a detailed description will be omitted from the following description.

Figure 3A:
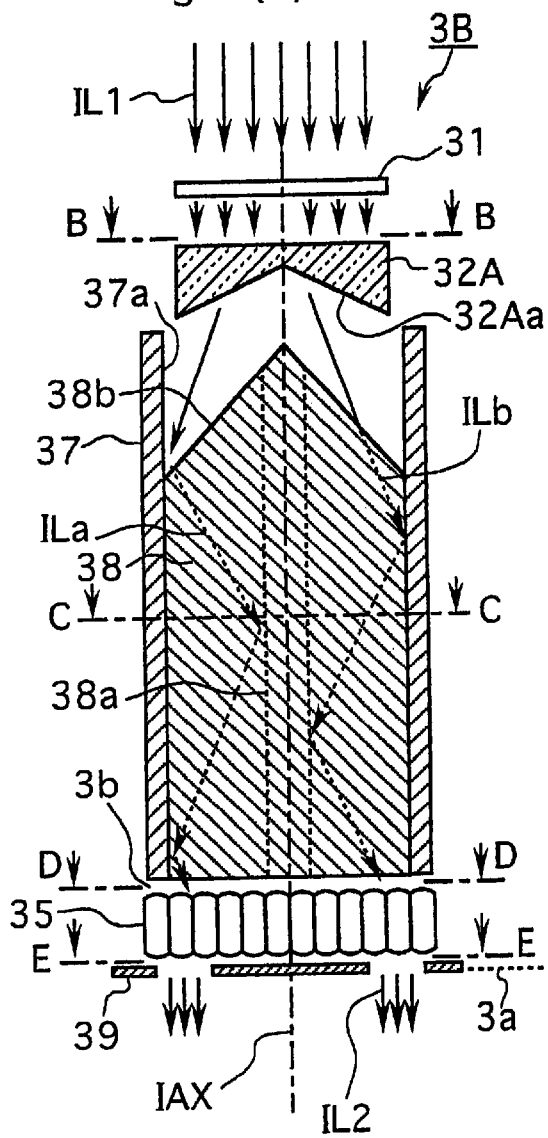
FIG. 3(A) is a side view in section showing a section of a second illuminance-uniformity unit 3B.
Figure 3B:
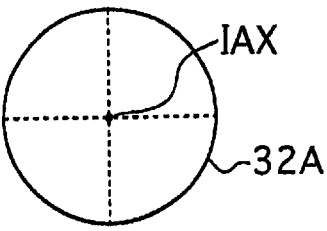
FIG. 3(B) is a view in section showing the second illuminance-uniformity unit 3B when taken along line B—B of FIG. 3(A).
Figure 3C:
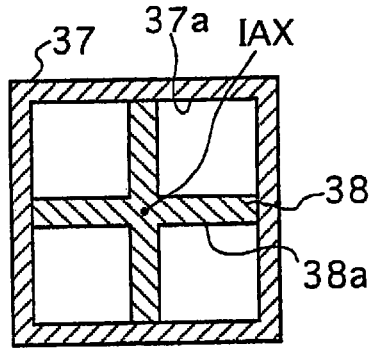
FIG. 3(C) is a view in section showing the second illuminance-uniformity unit 3B when taken along line C—C of FIG. 3(A).
Figure 3D:
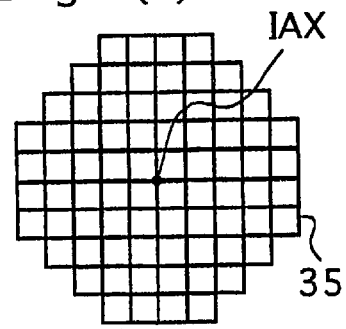
FIG. 3(D) is a view in section showing the second illuminance-uniformity unit 3B when taken along line D—D of FIG. 3(A).

FIG. 3(A) is a side view depicting a section of the second illuminance-uniformity unit 3B for use in this embodiment. As shown in FIG. 3(A), the illumination light IL1 left from the shaping optical system 2 of FIG. 1 enters into the clearance provided between a first reflecting member 38 and a second reflecting member 37 through the diffusion plate 31 and a pyramid prism 32A (see FIG. 3(B)) with the light-leaving plane in the form of a concave quadruple pyramid plane form. The first reflecting member 38 for use in this embodiment may be made of metal having a shape in section in the cross form with the optical axis IAX disposed in the center, as shown in FIG. 3(C), or of glass in a prism form (more specifically, twelve parallel sides, etc.) and have a sharp edge on its light-entering plane side, as shown in FIG. 3(A). The first reflecting member 38 may be further configured such that its outer side plane acts as the reflecting plane 38a with a reflecting coating coated thereon and that the opposite edge portion thereof acts as a reflecting plane 38b.

On the other hand, the second reflecting member 37 is disposed in abutment with the outer side surface of the first reflecting member 38 and the shape in section may be made of metal in a square frame form, as shown in FIG. 3(C), or glass in a prism form. For the second reflecting member 37, the inner side planes (square prism sides) act as a reflecting plane 37a with a reflecting coating coated thereon. This configuration can provide a uniform clearance with four sections each in a square form along the optical axis IAX between the first and second reflecting members 37 and 38. The reflecting members 37a, 38a and 38b enclosing the clearance can perform multiple illumination by means of the illumination light ILa and ILb passed through the pyramid prism 32A. This can achieve the uniformity in the distribution of illuminance each in the clearances with a square shape in section and form a illuminating light flux having each of the four uniform sections in a square shape.

Figure 3E:
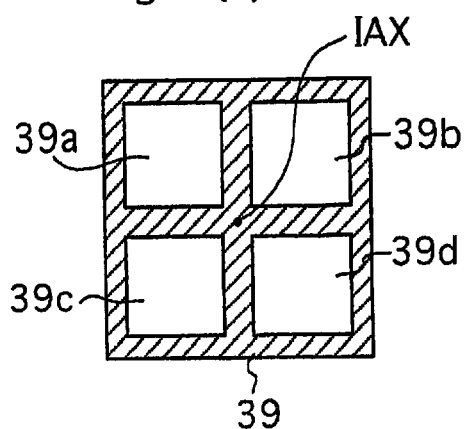
FIG. 3(E) is a view in section showing the second illuminance-uniformity unit 3B when taken along line E—E of FIG. 3(A).

In this embodiment, the fly-eye lens 35 is disposed in close vicinity of the light-leaving plane 3b of the illumination light, and a stop 39 with four apertures 39a to 39d, inclusive, each in a square shape in section, as shown in FIG. 3(E), is disposed on the focal plane on the light-leaving side of the fly-eye lens 35 (i.e., the light-leaving plane 3a of the illuminance-uniformity unit 3B). The illumination light left from the clearance provided between the reflecting members 37 and 38 is led to the relay lens 4A of FIG. 1 through the fly-eye lens 35 and the stop 39. The use of the illuminance-uniformity unit 3B can perform a modified illumination using the illumination light from the four secondary light sources with the optical axis IAX disposed in the center. In each case, this illumination can provide a uniform distribution of illuminance for the illumination light IL2, and the illuminance is maintained at a high level, due to the use of the reflecting members 37 and 38. Therefore, a high throughput can also be achieved.

As the pyramid prism 32A is used in this embodiment to divide the entering illumination light IL1 into four light fluxes, the illumination light can be utilized at a high efficiency rate. A conical prism 32 of FIG. 2 may also be used in place of the pyramid prism 32A because a loss of the quantity of light is slight. In this case, too, a diffraction grating of a phase type can be used to divide the illumination light into light fluxes, as in the case of the first illuminance-uniformity unit 3A.

The use of the first reflecting member 38 is more effective because the first reflecting member 38 is in a sharp edge shape at the top end of the reflecting plane 38b so that a loss of the illumination light can be lessened, like in the case of the first reflecting member 34 as shown in FIG. 2. Furthermore, the illuminance-uniformity unit 3B forms four illuminating light fluxes each in a square shape from its light-leaving plane 3b. The sectional shape of each of the illuminating light fluxes, however, is not limited to a square shape and it may be any optional shape including, for example, circle, a fan-like shape or a circle divided into four sections (i.e., quadrant), etc.

Figure 4:
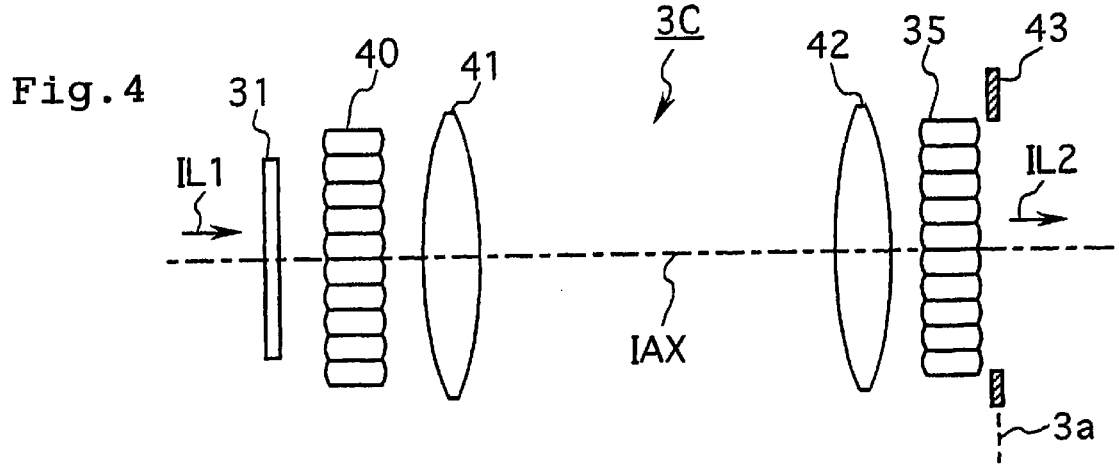
FIG. 4 is a partially cut-away view showing the configuration of a third illuminance-uniformity unit 3C.

A description turns now to the configuration of the third illuminance-uniformity unit 3C for use in this embodiment, with reference to FIG. 4. It is preferred that the secondary light source is arranged to perform ordinary circular illumination as conditions for illumination for use in situ in the exposure process, in addition to the secondary light source for a ring illumination and with four apertures (i.e., four light sources). The third illuminance-uniformity unit 3C for use in this case comprises a two-stage fly-eye lens which can be used in an ordinary illumination. In FIG. 4, the same parts and elements of the unit of FIG. 4 as those of FIG. 2 are provided with the same reference numerals and symbols and a detailed description is omitted from the description that follows.

FIG. 4 shows the configuration of the illuminance-uniformity unit 3C. When the illuminance-uniformity unit 3C is interposed between the shaping optical system 2 and the first relay lens 4A as depicted in FIG. 1, the illumination light IL1 left from the shaping optical system 2 of FIG. 1 enters the first-stage fly-eye lens 40 after passage of the diffusion plate 31, and the illumination light is left from each image of the light sources of the fly-eye lens 40 entering into the second-stage fly-eye lens 35 through the relay lens 41 and the relay lens 42. The illumination light left from the fly-eye lens 35 enters into a stop 43 with a circular aperture and is left therefrom as the illumination light IL2, the stop 43 being disposed on the focal plane on the light-leaving side of the fly-eye lens 35 (i.e., the light-leaving plane 3a of the illuminance-uniformity unit 3C). The illumination light IL2 left from the fly-eye lens 35 and pass through the stop 43 is then led to the relay lens 4A of FIG. 1.

The conditions for illumination have to be shifted in accordance with a pattern on the reticle R to be transferred upon actual exposure. In order to meet this requirement, the projection exposure apparatus in this embodiment is provided with a shift mechanism that shifts the above three illuminance-uniformity units 3A, 3B and 3C so as to be disposed on the optical axis IAX of the illumination light.

Figure 5:
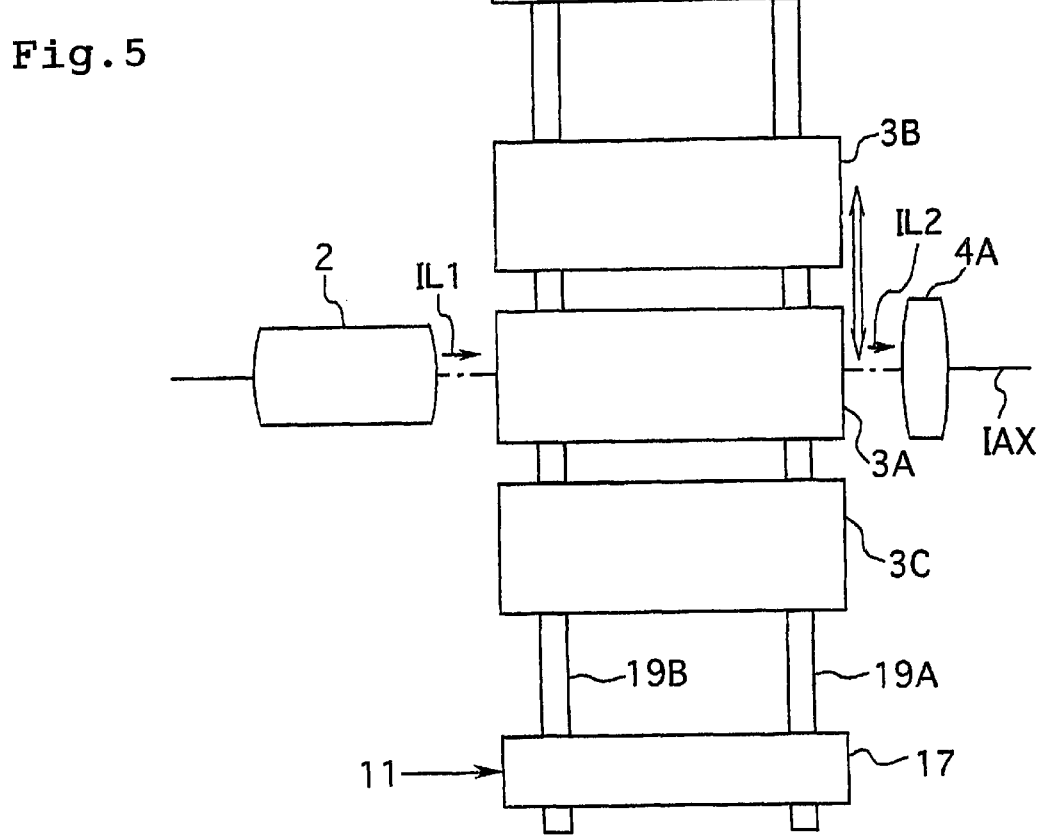
FIG. 5 is a view showing a shift mechanism of the illuminance-uniformity units for use in the first embodiment of the present invention.

FIG. 5 shows such a shift mechanism. As shown in FIG. 5, two sliders 19A and 19B are interposed between the shaping optical system 2 and the first relay lens 4A and the third, first and second illuminance-uniformity units 3C, 3A and 3B are disposed in this order, respectively, so as to be slidable along the two sliders 19A and 19B. A drive unit 17 of a feed screw type or the like which drives the illuminance-uniformity units 3A, 3B and 3C is disposed on a one side of the sliders assembly 19A and 19B and a stopper 18 is disposed on the other side thereof. The action of the drive unit 17 is controlled by the main control system 11 of FIG. 1. The main control system 11 can select the optimal one from the three illuminance-uniformity units in accordance with a pattern on the reticle R as an object of transcription and arrange the optimal illuminance-uniformity unit selected on the optical axis IAX between the shaping optical system 2 and the relay lens 4A by the aid of the drive unit 17. This configuration can achieve any different modes of illumination at a high illuminance level in accordance with a pattern on the reticle, including a ring illumination, illumination through four apertures, as well as an ordinary illumination where the distribution of the illumination light on a pupil plane is in a circular form.

The fly-eye lenses 35 and 40 for use in the first embodiment comprise each a large number of lens elements arranged in a relationship closely attached to one another. The array of the lens elements may be arranged, for instance, in such a manner that an odd-line of the lens elements is deviated from an even-line of the lens elements or vice versa by a half pitch. Moreover, it is preferred that the shape in section of the lens elements, or the lens elements of the last-stage fly-eye lens in the case of a plural-stage fly-eye lens, approximates to an illumination region on the reticle in order to increase an efficiency of utilization of the illumination light. As an example, the shape in section of the lens elements may preferably be an elongated rectangular shape when a scanning exposure apparatus is used, because the illumination region for the scanning exposure apparatus is in an elongated rectangular shape.

A description will now be given regarding the second embodiment of the present invention with reference to FIG. 6. The optical integrator 43 containing the rod lens on the light-leaving plane side of the two reflecting members is disposed in the second embodiment while the fly-eye lens 35 is disposed on the light-leaving plane side of the two reflecting members as the optical integrator (homogenizer). In FIG. 6, the same parts and elements as those of FIG. 2 are provided with the same reference numerals and symbols, and a duplicate description is omitted for brevity of explanation.

FIG. 6(A) shows the illuminance-uniformity unit for use in this embodiment, which has the illuminance-uniformity unit disposed between the shaping optical system 2 and the second relay lens 4B, for example, as shown in FIG. 1. In FIG. 6(A), the entered illumination light IL1 enters into the clearance between the reflecting members 33 and 34 through the diffusion plate 31 and the conical prism 32, and the illumination light left from the clearance therebetween enters into the rod lens 45 through the lens 44. The optical integrator 43 is composed of the lens 44 and the rod lens 45, and the illumination light left from the rod lens 45 enters into the second relay lens 4B as depicted for example in FIG. 1.

In this configuration, the light-leaving plane 3b of the reflecting members 33 and 34 is disposed in an optical Fourier transformation relationship with the light-entering plane 45a of the rod lens 45. When the fly-eye lens 35 of FIG. 2 is used, the light-leaving plane 3a is in an optical Fourier transformation relationship with the pattern plane of the reticle R of FIG. 1. When the rod lens 45 is used as in this configuration, the light-entering plane 45a and the light-leaving plane 45b of the rod lens 45 are set to be each in an imaging relationship (conjugated) with the pattern plane of the reticle R of FIG. 1. Therefore, the light-leaving plane 3b of the reflecting members 33 and 34 constitutes a pupil plane for the pattern plane of the reticle R.

As shown in FIG. 6(A), the light-leaving plane 3b of the reflecting members 33 and 34 is provided with a stop 50 that eventually sets the distribution of the secondary light sources at a high precision level.

Furthermore, a tubular body 45A may be used in this embodiment, in place of the rod lens 45 composed of a rod or rods made of glass or the like, the tubular body having an inner plane in the surface form of a prism, as shown in FIG. 6(B), and the inner plane as a reflecting plane 45Aa. This configuration can improve an efficiency of illumination for the exposure apparatus using an extreme ultraviolet light (an EUV light) that is less available as a light transparent material and using even exposure beams such as X-rays and so on.

When the exposure apparatus in the above embodiment is manufactured, the two sliders 19A and 19B acting as the shift mechanism, for example, as shown in FIG. 5, are aligned and disposed between the shaping optical system 2 and the relay lens 4A within the illumination optical system. After the alignment has been completed, a support member for the illuminance-uniformity unit 3A, as shown in FIG. 2, is mounted slidably on the sliders 19A and 19B. Then, the reflecting members 33 and 34 connected to each other through the spacers 51 and 52, as shown in FIG. 2(A), the conical prism 32, the fly-eye lens 35 and so one may be aligned with one another and then mounted on this support member. The illuminance-uniformity unit 3B and the other units can be assembled in the manner as described above. After the assembly of the illumination optical system and otherwise, each optical member of the optical system is subjected to optical adjustments for the axis in the manner as described above.

Then, the projection optical system PL is incorporated into the main body of the exposure apparatus and subjected to optical adjustments, and the reticle stage and the wafer stage, each consisting of a large number of parts, are incorporated therein. After incorporation, wiring and pipes are mounted and connected, and the assembled apparatus is subjected to overall adjustments, including electrical adjustments, adjustments for action confirmation, etc. The exposure apparatus can be used practically after the finish of such overall adjustments. It is preferred that the exposure apparatus is produced in a clean room where temperature, cleanness and other conditions are managed.

When a vacuum ultraviolet light (VUV light) such as ArF excimer laser (having a wavelength of 193 nm) or $F_2$ laser (having a wavelength of 157 nm) is used for the exposing illumination light, a higher illuminance can be gained on the wafer plane by using a material as a lass material for a refractive element (e.g., glass, etc.) within the illumination optical system and the projection optical system PL, which has a relatively high degree of transparency even in a vacuum ultraviolet region, such as quartz (particularly synthetic quartz), fluorine-doped quatz, fluorite ($CaF_2$), magnesium fluoride ($MgF_2$), rock crystal and so on. In place of such a vacuum ultraviolet light, e.g., ArF excimer laser or $F_2$ laser, there may also be used, for example, a DFB (Distributed Feedback) semiconductor laser or higher harmonics with its wavelength shifted to ultraviolet light by using a nonlinear optical crystal after amplification of a laser light having a single wavelength in an infrared region or a visible region oscillated from a fiber laser by means of a fiber amplifier doped with erbium (Er) or a combination of erbium with ytterbium (Yb).

For instance, when the oscillating wavelength of the laser light of a single wavelength is in the range from 1.51 $\mu$m to 1.59 $\mu$m, there can be generated an eight-fold higher harmonics having a wavelength in the range of 189 nm to 199 nm and a ten-fold higher harmonics having a wavelength in the range of 151 nm to 159 nm. In particular, when the oscillating wavelength is in the range of 1.544 $\mu$m to 1.553 $\mu$m, there can be obtained an eight-fold higher harmonics having a wavelength in the range of 193 nm to 194 nm, that is, an ultraviolet light having the wavelength approximately identical to that of ArF excimer laser. And, when the oscillating wavelength is in the range of 1.57 $\mu$m to 1.58 $\mu$m, there can be obtained a ten-fold higher harmonics having a wavelength in the range of 157 nm to 158 nm, that is, an ultraviolet light having the wavelength approximately identical to that of $F_2$ laser.

Furthermore, when the oscillating wavelength is in the range of 1.03 $\mu$m to 1.12 $\mu$m, there can be obtained a seven-fold higher harmonics having a wavelength in the range of 147 nm to 160 nm. In particular, when the oscillating wavelength is in the range of 1.099 $\mu$m to 1.106 $\mu$m, there be obtained a seven-fold higher harmonics having a wavelength in the range of 157 nm to 158 nm, that is, an ultraviolet light having the wavelength approximately identical to that of $F_2$ laser. As the fiber laser that can oscillate at a single wavelength, there may be used, for example, ytterbium-doped fiber laser.

When the exposing illumination light is in an extreme ultraviolet (EUV) light region, the illumination optical system and the projection optical system can be used as a reflection system by using, for example, an optical member as shown in FIG. 6(B) and a concave mirror, a convex mirror, a flat mirror or the like. In this case, a reticle of a reflection type is used.

It is further understood that the magnification of the projection optical system PL in the above embodiments may be of a reduced type, an equal type or an enlarged type and further that the present invention can be applied to, for example, an illumination optical system of an exposure apparatus of a proximity type that does not use a projection optical system.

Furthermore, it is to be understood that the exposure apparatus according to the present invention is not restricted to an exposure apparatus for use in producing semiconductors and that it can be applied, for example, to an exposure apparatus for the production of liquid crystal by exposing a pattern of a liquid crystal display element to a rectangular glass plate and to an exposure apparatus which produces thin film magnetic heads.

Moreover, semiconductor devices may be produced through the step of designing functions and performance of the devices, the step of producing a reticle on the basis of the previous step, the step of producing a wafer from silicon material, the step of exposing a pattern of the reticle onto the wafer by the exposure apparatus according to the above embodiments of the present invention, the step of assembling devices (including the dicing step, bonding step and packaging step), the inspection step, and so on.

It has to be noted herein that the present invention is not restricted in any respect to the embodiments as described above and it has to be interpreted as encompassing various modifications without departing from the spirit and scope of the invention and that the entire disclosure of Japanese Patent Application No 9-306,952 filed on Nov. 10, 1997, including specification, claims, drawings and summary is incorporated by reference in its entirety.

INDUSTRIAL UTILIZATION

The first and second exposure apparatuses according to the present invention can achieve the least possible reduction of a loss in the illumination light and allow a modified illumination at a high illuminance and at a highly uniform distribution of illuminance. This can realize an exposure apparatus having a high resolution, a deep depth of focus and a high processing ability. The exposure apparatus can produce semiconductor devices and the like with a high degree of accuracy at a high throughput.

The illuminance-uniformity units or the bar-shaped optical elements for use in the present invention can be comprised of a hollow reflection type, unlike conventional rod lenses or fly-eye lenses, so that they can also be applied to an exposure apparatus that can use a light source using a less available transparent material, for example, a light source in a vacuum ultraviolet light, e.g., having a wavelength of about 200 nm or less or an X-rays source (e.g., SOR (Synchrotron Orbital Radiation) ring or laser plasma light source) that can output X-rays containing a soft X-rays region having a wavelength of about 5 nm to 15 nm or a hard X-rays region.

When an EUV light having an oscillating spectrum at a wavelength of about 5 nm to 15 nm is used as an exposing illumination light, the projection optical system may comprise, for example, several sheets of reflection elements (e.g., mirror, etc.) only.

Furthermore, when the two reflecting members or the bar-shaped optical elements are disposed in series and the optical integrator is disposed, devices with a higher precision can be produced as the uniformity in distribution of illuminance can be increased.

In addition, the present invention allows an exposure of a variety of patterns on a mask under optimal illumination conditions by providing a plurality of the illuminance-uniformity optical systems to thereby enable shifting of the shapes of the reflecting plane of the first reflecting member for each optical system.

When the optical integrator is disposed in a row with the illuminance-uniformity optical systems or the bar-shaped optical elements so as to shift them, the exposure apparatus according to the present invention can also provide ordinary illumination.

What is claimed is:

1. An exposure apparatus which transfers a pattern formed on a mask onto a substrate through a projection optical system under an exposing illumination light from an illumination optical system, comprising:
    an illuminance-uniformity optical system which includes a first reflecting member and a second reflecting member disposed enclosing the first reflecting member, the first reflecting member having a first reflecting plane formed on the outside of a columnar body, and the second reflecting member having a second reflecting plane formed on the inner side of a tubular body and facing the first reflecting plane, and located within the illumination optical system;
    wherein the illuminance of the illumination light is made uniform by repeated reflection of the illumination light a plurality of times on the first reflecting plane and the second reflecting plane.

2. An exposure apparatus as claimed in claim 1, further comprising an optical integrator containing either a fly-eye lens or a rod lens disposed in series with the first and second reflecting members.

3. An exposure apparatus as claimed in claim 1, wherein the illuminance-uniformity optical system comprises plural optical systems that can be shifted to change a shape in section of the first reflecting plane of the first reflecting member.

4. An exposure apparatus as claimed in claim 1, further comprising an optical integrator containing either a fly-eye lens or a rod lens which is disposed in parallel with the illuminance-uniformity optical system, and which is disposed so as to be shifted.

5. An exposure apparatus as claimed in claim 1, wherein the first reflecting member comprises a columnar body, and the first reflecting member further comprises a conical body and a third reflecting plane formed on an outside of the columnar body, the conical body being disposed so as to be positioned at a light entering plane side of the illumination light relative to the columnar body and so as to set a tip end of the conical body to face a light entering direction of the illumination light.

6. An exposure apparatus as claimed in claim 5, further comprising a spacer in a ring shape made of a transparent material and which is interposed between the first reflecting member and the second reflecting member.

7. An exposure apparatus as claimed in claim 1, wherein the first reflecting member is a body having a shape in section of a plane perpendicular to an optical axis of the illumination optical system in a cross form with the optical axis disposed in the center.

8. An exposure apparatus as claimed in claim 1, further comprising an optical element which shapes a distribution of illuminance in a ring shape within a plane perpendicular to the optical axis of the illumination optical system, the optical element being disposed on the light-entering planes of the first and second reflecting members.

9. An exposure apparatus as claimed in claim 1, wherein the exposing illumination light contains vacuum ultraviolet light or X-rays.

10. An exposure apparatus as claimed in claim 1, wherein the exposing illumination light contains X-rays having a central wavelength of 5 to 15 nm.

11. A method for manufacturing a predetermined device using an exposure apparatus as claimed in claim 1, comprising the step of transferring an image of a pattern formed on the mask onto the substrate via the exposure apparatus.

12. An exposure apparatus as claimed in claim 1, wherein the first reflecting member comprises a prismatic body, and the first reflecting member further comprises a pyramidal body and a third reflecting plane formed on an outside of the pyramidal body, the pyramidal body being disposed so as to be positioned at a light entering side of the illumination light relative to the prismatic body, and so as to be set a tip end of the pyramidal body to face a light entering direction of the illumination light.

13. An exposure apparatus having an illumination optical system which illuminates a mask with an illumination light to transfer a pattern formed on the mask onto a substrate, comprising:
    a bar-shaped optical system disposed on the optical axis of the illumination optical system, the bar-shaped optical system having a first reflecting plane and a second reflecting plane, each reflecting the illumination light within the inside;
    wherein the illumination light is left from outside a partial region containing the optical axis on the light-leaving plane of the bar-shaped optical system after an illumination of the illumination light being made uniform by repeated reflection of the illumination light a plurality of times on the first reflecting plane and the second reflecting plane.

14. An exposure apparatus as claimed in claim 13, wherein a region of distribution of the illumination light defined by the first reflecting plane and the second reflecting plane on the light-leaving plane side of the bar-shaped optical system is in a ring form.

15. An exposure apparatus as claimed in claim 13, wherein the partial region defined by the first reflecting plane and the second reflecting plane on the light-leaving plane side of the bar-shaped optical system is in a cross form.

16. An exposure apparatus as claimed in claim 13, wherein the illumination optical system contains an optical integrator disposed on the light-leaving plane side of the bar-shaped optical system.

17. An exposure apparatus as claimed in claim 16, wherein the optical integrator is a fly-eye lens that is disposed with the light-entering plane thereof in close vicinity of the light-leaving plane of the bar-shaped optical system or with the light-entering plane thereof substantially conjugated with the light-entering plane of the bar-shaped optical system.

18. An exposure apparatus as claimed in claim 17, wherein the illumination optical system is disposed in close vicinity of the light-entering plane side of the fly-eye lens, and the illumination optical system contains a stop having an aperture resembling an arrangement of a plurality of optical elements constituting the fly-eye lens.

19. An exposure apparatus as claimed in claim 17, wherein the fly-eye lens has a focal plane on the light-leaving plane side thereof disposed on an optical Fourier transform plane for a pattern plane of the mask, and wherein said exposure apparatus further comprises a stop defining a shape of a secondary light source disposed between the fly-eye lens and the mask within the illumination optical system.

20. An exposure apparatus as claimed in claim 16, wherein the optical integrator contains a rod lens; and the rod lens has the light-entering plane disposed on an optical Fourier transform plane for the light-leaving plane of the bar-shaped optical system.

21. An exposure apparatus as claimed in claim 20, wherein the rod lens has the light-leaving plane disposed on a plane substantially conjugated with the pattern plane of the mask; and the illumination optical system contains a stop disposed on an optical Fourier transform plane for the pattern plane of the mask.

22. An exposure apparatus as claimed in claim 21, wherein the stop is disposed in a position closer to the bar-shaped optical system than the rod lens.

23. An exposure apparatus as claimed in claim 13, wherein the illumination optical system contains a second bar-shaped optical element having a shape of the light-leaving plane different from that of the bar-shaped optical system; and the bar-shaped optical system and the second optical element are exchanged for each other and disposed on the optical axis of the illumination light.

24. An exposure apparatus as claimed in claim 23, wherein the illumination optical system contains an optical integrator disposed on the optical axis of the illumination light by being exchanged for the bar-shaped optical system or the second bar-shaped optical element; and either of the bar-shaped optical system, the second bar-shaped optical element or the optical integrator is selected and disposed on the optical axis of the illumination light, in accordance with a pattern on the mask.

25. An exposure apparatus having an illumination optical system which illuminates a mask with an illumination light and transfers a pattern formed on the mask onto a substrate, comprising:

a bar-shaped optical system disposed on an optical axis of the illumination optical system and provided with a light-entering plane and a light-leaving plane of the illumination light, respectively;

wherein the bar-shaped optical system distributes the illumination light entered into the light entering plane thereof to a first partial region differing from a second partial region containing the optical axis on the light-leaving pane thereof, and uniforms an illuminance distribution of the illumination light in the first partial region.

26. An exposure apparatus as claimed in claim 25, wherein the mask is illuminated by the illumination light left from the leaving-plane of the bar-shaped optical system, the illumination light being distributed in the first partial region differing from the second partial region containing the optical axis on the light-leaving plane, and the illuminance distribution of the illumination light in the first partial region being uniformed.

27. An exposure apparatus as claimed in claim 26, wherein the illumination optical system comprises an optical integrator disposed at the light-leaving plane side of the bar-shaped optical system.

28. An exposure apparatus as claimed in claim 27, wherein the optical integrator includes a rod lens.

29. A method for manufacturing an exposure apparatus which transfers a pattern formed on a mask onto a substrate through a projection optical system under an exposing illumination light from an illumination optical system, comprising:

locating within the illumination optical system a first reflecting member having a first reflecting plane formed on the outer side of a columnar body and a second reflecting member enclosing the first reflecting member, the second reflecting member having a second reflecting plane formed on the inner side of a tubular body and facing the first reflecting plane, to thereby incorporate an illumination-uniformity optical system that makes uniform an illuminance of the illumination light by repeated reflection of the illumination light a plurality of times on the first reflecting plane and the second reflecting plane.

30. A method for manufacturing an exposure apparatus having an illumination optical system which illuminates a mask with an illumination light and transfer a pattern formed on the mask onto a substrate through a projection optical system, comprising:

preparing a bar-shaped optical system having a first reflection plane and a second reflecting plane, each reflecting the illumination light within the bar-shaped optical system; and aligning and locating the bar-shaped optical system on the optical axis of the illumination optical system so as for the illumination light passing through a clearance provided between the first and second reflecting planes to be left from outside of a partial region containing the optical axis on the light-leaving plane of the bar-shaped optical system, to thereby make uniform an illuminance of the illumination light, which is left from outside of the partial region, by repeated reflection of the illumination light a plurality of times on the first reflecting member and the second reflecting member.

* * * * *